(12) United States Patent
Yumoto et al.

(10) Patent No.: US 11,289,400 B2
(45) Date of Patent: Mar. 29, 2022

(54) METHOD OF MANUFACTURING BONDED BODY FOR INSULATION CIRCUIT SUBSTRATE BOARD AND BONDED BODY FOR INSULATION CIRCUIT SUBSTRATE BOARD

(71) Applicant: MITSUBISHI MATERIALS CORPORATION, Tokyo (JP)

(72) Inventors: Ryohei Yumoto, Saitama (JP); Tomoya Oohiraki, Saitama (JP); Takeshi Kitahara, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 17/040,096

(22) PCT Filed: Mar. 25, 2019

(86) PCT No.: PCT/JP2019/012326
§ 371 (c)(1),
(2) Date: Sep. 22, 2020

(87) PCT Pub. No.: WO2019/188885
PCT Pub. Date: Oct. 3, 2019

(65) Prior Publication Data
US 2021/0028086 A1    Jan. 28, 2021

(30) Foreign Application Priority Data

Mar. 26, 2018 (JP) .............................. JP2018-058136

(51) Int. Cl.
*H05K 1/02* (2006.01)
*H05K 1/05* (2006.01)
(Continued)

(52) U.S. Cl.
CPC ...... *H01L 23/3735* (2013.01); *H01L 21/4857* (2013.01); *H05K 1/09* (2013.01);
(Continued)

(58) Field of Classification Search
CPC .. H05K 1/02; H05K 1/05; H05K 1/09; H05K 3/022; H05K 3/0097; H05K 3/0052;
(Continued)

(56) References Cited

U.S. PATENT DOCUMENTS

2005/0176175 A1* 8/2005 Kanakubo ............ H05K 3/0052
438/107
2015/0366048 A1* 12/2015 Nagase ............... H01L 23/4006
174/252

(Continued)

FOREIGN PATENT DOCUMENTS

JP    2008-192823 A    8/2008
JP    2011-216533 A   10/2011
(Continued)

OTHER PUBLICATIONS

International Search Report dated May 21, 2019, issued for PCT/JP2019/012326.
(Continued)

*Primary Examiner* — Xiaoliang Chen
(74) *Attorney, Agent, or Firm* — Locke Lord LLP

(57) ABSTRACT

Forming aluminum circuit layers forming an aluminum circuit layers on one surface of a ceramic substrate and forming copper circuit layers are included. The copper circuit layers are formed by laminating copper boards for the circuit layers on the respective aluminum circuit layers, arranging the laminate between a pair of support boards having a convex curved surface at least on one surface so as to face to each other, moving the support boards in a facing direction to press the laminate in a lamination direction, and
(Continued)

heating in this pressing state so that the copper boards for the circuit layers are bonded on the aluminum circuit layers respectively by solid phase diffusion. In the step of forming the copper circuit layers, the support boards are arranged so that either one of the convex curved surface is in contact with the adjacent copper boards for the circuit layers in the laminate.

26 Claims, 7 Drawing Sheets

(51) Int. Cl.
| | |
|---|---|
| *H05K 1/09* | (2006.01) |
| *H05K 3/22* | (2006.01) |
| *H01L 21/48* | (2006.01) |
| *H01L 21/52* | (2006.01) |
| *H01L 23/367* | (2006.01) |
| *H01L 23/373* | (2006.01) |
| *H01L 23/473* | (2006.01) |
| *H05K 3/00* | (2006.01) |
| *H05K 3/02* | (2006.01) |

(52) U.S. Cl.
CPC ........... *H05K 3/0097* (2013.01); *H05K 3/022* (2013.01); *H05K 3/0052* (2013.01); *H05K 2201/0341* (2013.01); *H05K 2201/0379* (2013.01); *H05K 2203/068* (2013.01)

(58) Field of Classification Search
CPC ... H05K 2201/0341; H05K 2201/0379; H05K 2203/068; H01L 21/48; H01L 21/52; H01L 21/481; H01L 21/565; H01L 21/4857; H01L 21/4871; H01L 21/4878; H01L 21/4882; H01L 23/367; H01L 23/373; H01L 23/473; H01L 23/3675; H01L 23/3735; H01L 23/3736; H01L 23/4006
USPC ....... 174/257, 252, 255; 257/43, 707; 438/3, 438/107, 109
See application file for complete search history.

(56) References Cited

U.S. PATENT DOCUMENTS

| | | | |
|---|---|---|---|
| 2016/0254209 | A1* | 9/2016 | Oohiraki ................. H01L 23/12 257/707 |
| 2017/0047268 | A1* | 2/2017 | Terasaki ................ C04B 37/026 |
| 2017/0154855 | A1 | 6/2017 | Di et al. |

FOREIGN PATENT DOCUMENTS

| | | |
|---|---|---|
| JP | 2012-038825 A | 2/2012 |
| JP | 2014-160799 A | 9/2014 |
| JP | 2015-170825 A | 9/2015 |
| JP | 2015-170826 A | 9/2015 |
| JP | 2015-211125 A | 11/2015 |
| JP | 2016-018887 A | 2/2016 |
| JP | 2016-072563 A | 5/2016 |
| JP | 2016-167548 A | 9/2016 |

OTHER PUBLICATIONS

Supplementary European Search Report mailed Dec. 13, 2021, issued for European Patent Application No. 19776886.4.

* cited by examiner

METHOD OF MANUFACTURING BONDED BODY FOR INSULATION CIRCUIT SUBSTRATE BOARD AND BONDED BODY FOR INSULATION CIRCUIT SUBSTRATE BOARD

BACKGROUND OF THE INVENTION

Technical Field

The present invention relates to a method of manufacturing a bonded body for an insulation circuit substrate board such as a power module substrate board used for a semiconductor device controlling large current and high voltage. Priority is claimed on Japanese Patent Application No. 2018-58136, filed Mar. 26, 2018, the content of which is incorporated herein by reference.

Background Art

Power module substrate boards in which a circuit layer is bonded on one surface of an insulation layer made of a ceramic substrate board such as aluminum nitride, and a metal layer for heat dissipation is bonded on the other surface are known, and a heat sink is bonded on the metal layer.

For example, in a power module substrate board equipped with a heat sink disclosed in Patent Document 1, a circuit layer having a double structure of an aluminum layer and a copper layer is formed on one surface of an insulating layer made of a ceramic substrate board; on the other surface of the ceramic substrate board (the insulation layer), a metal layer having a double structure of an aluminum layer and a copper layer is bonded; and a heat sink made of aluminum is bonded on this copper layer of the metal layer.

In a method of manufacturing this power module substrate board equipped with a heat sink, aluminum boards are brazed on both surfaces of the ceramic substrate board at first, after that, a copper board is laminated on one side and a copper board and an aluminum board of the heat sink is laminated on the other side, and this laminate is heated with pressed in a lamination direction, so that aluminum and copper is bonded by solid phase diffusion. At this time, in Patent Document 1, a bonded surface of the heat sink is bonded with formed in a convex shape in accordance with warp of a surface of the metal layer of the power module substrate board occurred by a bonding temperature of the heat sink.

In this solid phase diffusion bonding, the laminate is arranged between a pair of pressing boards which are energized by a spring and given a load by bringing close the pressing boards by energizing by a fixed board fixed on a pair of guide posts provided outside of an outer peripheral of the ceramic substrate board.

CITATION LIST

Patent Document 1: Japanese Unexamined Patent Application, First Publication No. 2016-72563

SUMMARY OF INVENTION

Technical Problem

However, since the guide posts cannot be arranged right on the laminate, it is difficult to add the load on the inside comparing to the outside of the ceramic substrate board. The ceramic substrate board and the aluminum board can be substantially evenly bonded in a whole surface since a liquid phase is generated by brazing; however, the aluminum layer and the copper layer are bonded by the solid phase, and a contact state thereof largely influences on bonding. By bonding using the above-described pressing boards, the load is biased on the outside of the circuit layer but is not enough on the inside, and bonding defects may occur in other parts than the outside part of the metal layer. Particularly, in a case in which the circuit layer is separated several, sufficient intermetallic composed layers are not generated at inside peripheral edge parts facing a space between adjacent copper boards for circuit layers, and the bonding defects may occur easily.

The present invention is achieved in consideration of the above circumstances, and has an object to prevent the bonding defects by adding the uniform load even on the inner edge parts facing the space between the adjacent copper boards for the circuit layers.

Solution to Problem

A method of manufacturing a bonded body for an insulation circuit substrate board of the present invention includes steps of: forming an aluminum circuit layer forming a plurality of aluminum circuit layers on one surface on a ceramic substrate board; and a step of forming a copper circuit layer, by laminating copper boards for the circuit layers respectively on the aluminum circuit layers; arranging this laminate between a pair of support boards having a convex curved surface on at least one surface and arranged to face the convex curved surfaces toward each other; and pressing the laminate in a lamination direction by moving the support boards to a facing direction and heating in this pressing state, so as to bond the copper boards on the aluminum circuit layers by solid phase diffusion. In the step of forming the copper circuit layers, the support boards are arranged so that at least one of the convex curved surfaces are in contact with a plurality of the copper boards for the circuit layers adjacent in the laminate.

According to this manufacturing method, in the step of forming copper circuit layers, the convex curved surface of the support board spans and is in contact with the adjacent copper board for circuit layers, so that a load is easy to be added as in the outer peripheral edge parts even in the edge part of the copper board for the circuit layers in a center of the ceramic substrate board where conventionally the load is not easy to be added.

A preferred aspect of the method of manufacturing a bonded body for an insulation circuit substrate board of the present invention is that the convex curved surfaces of the support boards preferably have a curvature radius not less than 8000 mm and not more than 60000 mm. By the curvature radius in this range, an intermetallic compound layer is formed with a sufficient thickness over the edge parts of the adjacent copper circuit layers and good bonding can be obtained.

A preferred aspect of the method of manufacturing a bonded body for an insulation circuit substrate board of the present invention is that preferably the support boards be made of a carbon material sheet. The carbon material sheet can be a laminate board of one or more carbon sheets and one or more graphite sheets.

By the carbon material sheet, it is possible to prevent the support boards and the laminate from adhering. By cushioning characteristic of the carbon material sheet, a gentle pressing gradient can be obtained in which the load is gradually increases from the outer peripheral side toward the center of the convex curved surface, so that the copper boards for the circuit layers can be pressed even uniformly over a whole surface and bonded.

In the method of manufacturing a bonded body for an insulation circuit substrate board of the present invention, the convex curved surface may be a spherical surface or may be a cylindrical surface. It is appropriate to set the shape of the convex curved surface in accordance with the number and an arrangement state of the copper boards for the circuit layers in the laminate.

In a bonded body for an insulation circuit substrate board of the present invention, in the support boards, the one surface maybe the convex curved surface and the other surface may be a flat surface. For example, among the support boards stacked with the laminates therebetween, the outermost support boards may have a flat surface which does not press the copper boards for the circuit layers; and the pressure from the pressing board can be received on the whole flat surface.

A preferred aspect of the method of manufacturing a bonded body for an insulation circuit substrate board of the present invention is that arranging a pair of the support boards between a pair of pressing boards facing in the lamination direction to each other, holding a pair of the pressing boards so as to approach or be away from each other along the lamination direction on at least two guide post provided along the lamination direction, and pressing the laminate with a pair of the support boards by approaching a pair of the pressing boards each other.

It is difficult to evenly press the laminate between a pair of the pressing boards held by the two guide posts; however, by the convex curved surface of the support boards, it is possible to add a sufficient load even on the center part of the laminates.

A bonded body for an insulation circuit substrate board of the present invention includes a ceramic substrate board, a plurality of aluminum circuit layers bonded on one surface of the ceramic substrate board, copper circuit layers bonded on the respective aluminum circuit layers by solid phase diffusion, and intermetallic compound layers between the aluminum circuit layers and the copper circuit layers; and in the intermetallic compound layers, a boundary is set at a position of 50 μm from an edge part beside a gap between the adjacent copper circuit layers, a thickness ratio t2/t1 is 30% or more where an average thickness in a center side of the boundary is t1 and an average thickness in an edge part side of the boundary is t2.

Since the average thickness t2 of the intermetallic compound layers beside the gaps between the copper circuit layers is 30% or more of the average thickness at the center side of the intermetallic compound layers, the edge parts are also adequately bonded by solid phase diffusion and a sufficient bonding state can be maintained.

In addition, this bonded body for an insulation circuit substrate board can be used in states of being used as an insulation circuit substrate board having a plurality of circuit layers as it is, or being formed into single insulation circuit substrate board by forming a scribe line on the ceramic substrate board between the adjacent copper circuit layers and splitting it.

Advantageous Effects of Invention

According to the present invention, it is possible to prevent the bonding defects by adding the uniform load even on the inner edge parts facing the space between the adjacent copper boards for the circuit layers.

DESCRIPTION OF EMBODIMENTS

Figure 1:
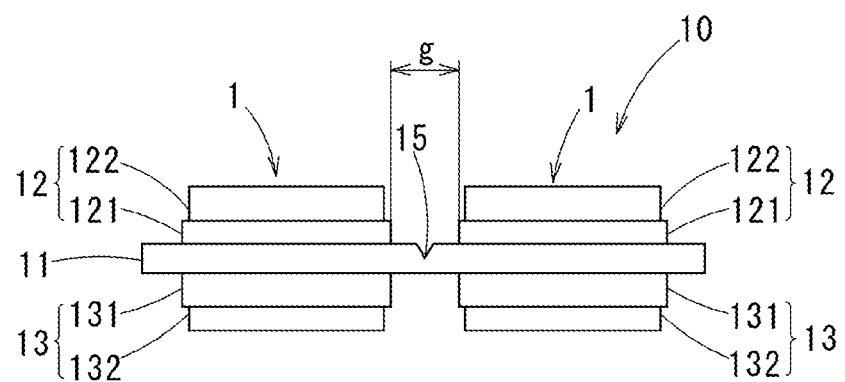
FIG. 1 It is a side view showing a bonded body for an insulation circuit substrate board manufactured by a method of manufacturing a bonded body for an insulation circuit substrate board according to an embodiment of the present invention.
Figure 2:
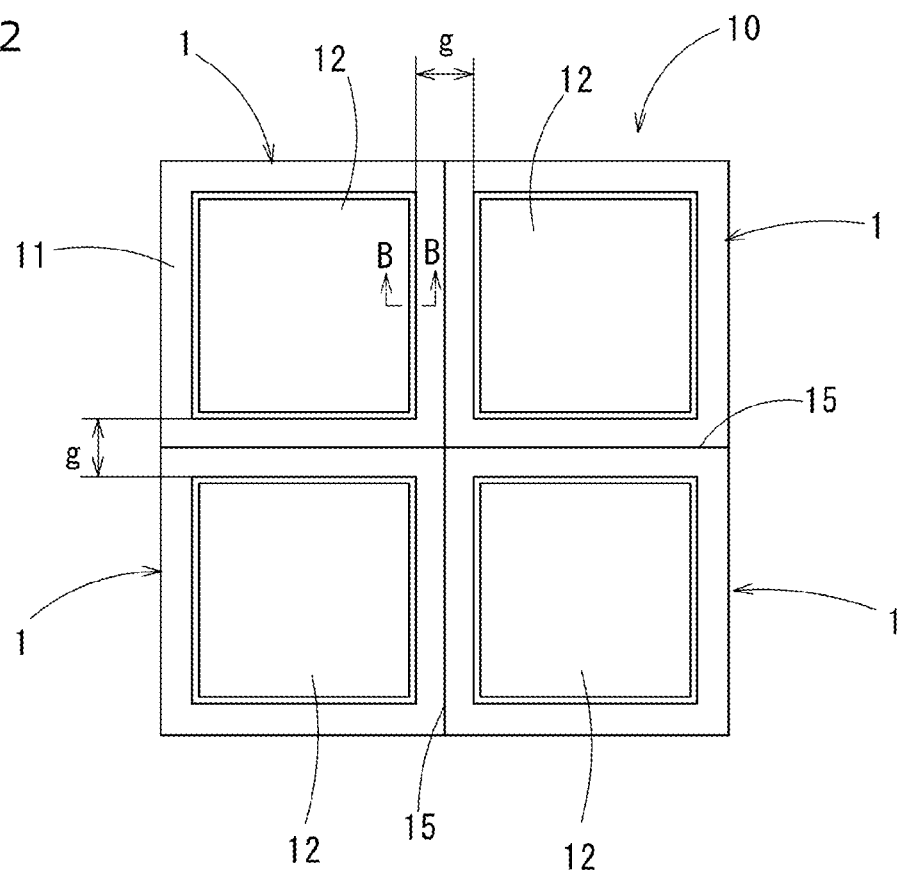
FIG. 2 It is a plan view of the bonded body for an insulation circuit substrate board shown in FIG. 1.

Hereinafter, embodiments of the present invention will be explained. FIG. 1 and FIG. 2 show a bonded body 10 for an insulation circuit substrate board for manufacturing a plurality of power module substrate boards (insulation circuit substrate boards) 1 as an example of the bonded body for the insulation circuit substrate board manufactured by a manufacturing method of the present invention. In the illustrated example, four power module substrate boards 1 can be manufactured.

The bonded body 10 for the insulation circuit substrate board has a ceramic substrate board 11, a plurality of circuit layers 12 bonded on one surface (a top surface) of the ceramic substrate board 11, and a plurality of heat radiation layers 13 bonded on the other surface (a bottom surface) of the ceramic substrate board 11. Regarding a plane size, each of the circuit layers 12 is a square shape with a side 5 mm or more and 100 mm or less; and a gap "g" between the respective circuit layers 12 is 1 mm or more and 20 mm or less. In this embodiment, the heat radiation layers 13 are also arranged with the same gap "g".

The ceramic substrate board 11 is an insulation material preventing an electrical connection between the circuit layers 12 and the heat radiation layers 13; e.g., it is formed by aluminum nitride (AlN), silicon nitride ($Si_3N_4$), or the like; and a board thickness thereof is 0.2 mm to 1.5 mm.

In this embodiment, scribe lines 15 are formed in a cross shape in planar view on the ceramic substrate board 11 to equally divide this into four.

The circuit layers 12 and the heat radiation layers 13 both have a double structure of an aluminum layer made of aluminum or aluminum alloy and a copper layer made of copper or copper alloy.

In this case, in the circuit layers 12, for each of the sections divided by the scribe lines 15, an aluminum circuit layer 121 and a copper circuit layer 122 are bonded in a laminate state; the scribe lines 15 are formed on the ceramic substrate board 11 along the gaps "g" of the adjacent circuit layers 12.

The aluminum layers which will be the circuit layers 12 are the aluminum circuit layers 121 and the aluminum layers which will be the heat radiation layers 13 are aluminum heat radiation layers 131; however, in a case of not being distinct particularly, they are called simply aluminum layers.

These aluminum layers 121 and 131 are made of aluminum or aluminum alloy: pure aluminum with purity 99.00% by mass or more or purity 99.99% by mass or more is preferable to reduce stress. A thickness of these aluminum layers 121 and 131 is preferably 0.1 mm to 1.0 mm. The aluminum circuit layers 121 and the aluminum heat radiation layers 131 may have the same thickness or may have different thickness.

These aluminum layers 121 and 131 are formed by brazing in which aluminum boards are laminated on both the surfaces of the ceramic substrate board 11 with Al—Si type brazing material therebetween, pressed in a lamination direction and heated.

Regarding copper layers which will be the circuit layers 12 and copper layers which will be the heat radiation layers 13, similarly to the aluminum layers, the copper layers which will be the circuit layers 12 are the copper circuit layers 122 and the copper layers which will be the heat radiation layers 13 are copper heat radiation layers 132; however, in a case of not being distinct particularly, they are called simply copper layers.

These copper layers 122 and 132 may be formed of copper or copper alloy; oxygen-free copper is appropriate. A planar size may be the same as that of the aluminum layers: in the illustrated example, they are formed to be slightly smaller than the aluminum layers. An appropriate board thickness is 0.1 mm or more and 6.0 mm or less: the copper circuit layers 122 and the copper heat radiation layers 132 may have the same thickness or may have different thickness.

The copper circuit layers 122 are formed by bonding copper boards by solid phase diffusion on the respective aluminum circuit layers 121; and the copper heat radiation layers 132 are formed by bonding copper boards by solid phase diffusion on the aluminum heat radiation layers 131.

Next, a method of manufacturing this bonded body 10 for insulation circuit substrate board will be explained. In a case of this embodiment, as shown in FIGS. 3A to 3D, manufacture is carried out with a step of forming scribe lines (FIG. 3A), a step of bonding an aluminum layer (FIG. 3B), a step of bonding a copper layer (FIG. 3C), and a step of dividing (FIG. 3D) in order.

—Step of Forming Scribe Lines—

Figure 3A:
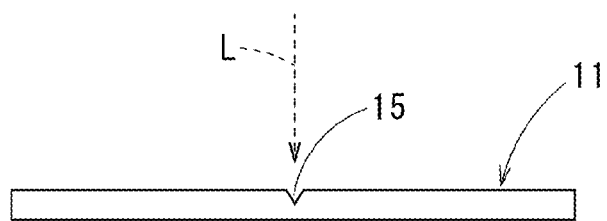
FIG. 3A It is a side view showing the method of manufacturing the bonded body for an insulation circuit substrate board in order.

The scribe lines 15 are formed on the ceramic substrate board 11 for dividing it into a plurality of the power module substrate boards 1. The scribe lines 15 can be formed by laser machining as shown in FIG. 3A. Specifically, the machining of the scribe lines 15 is carried out by emitting a laser light L such as a $CO_2$ laser, a YAG laser, a $YVO_4$ laser, and a YLF laser.

—Step of Forming Aluminum Layer (Step of Forming Aluminum Circuit Layer)—

Figure 3B:
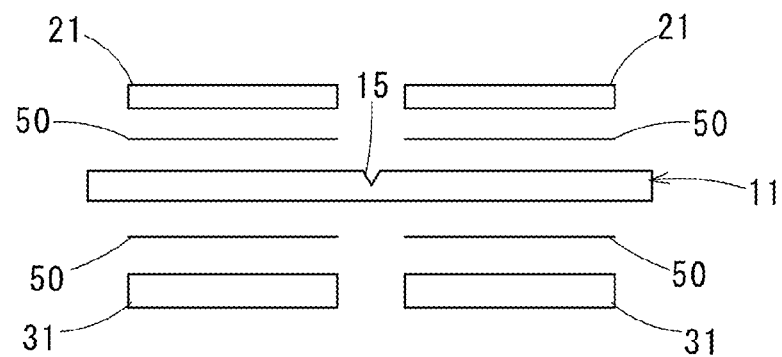
FIG. 3B It is a side view showing the method of manufacturing the bonded body for an insulation circuit substrate board in order.

As shown in FIG. 3B, a plurality of aluminum boards 21 for the circuit layers are laminated on a top surface of the ceramic substrate board 11 with braze foils 50 therebetween and a plurality of aluminum boards 31 for the heat radiation layers are laminated on a bottom surface of the ceramic substrate board 11 with the braze foils 50 therebetween. The aluminum boards 21 for the circuit layers and the aluminum boards 31 for the heat radiation layers are laminated in respective forming sections separated by the scribe lines 15 on the ceramic substrate board 11. Here, although the braze foils 50 are used for brazing, paste of brazing material may be applied on the surfaces of the ceramic substrate board 11.

Then, a laminate of the aluminum boards 21 for the circuit layers, the aluminum boards 31 for the heat radiation layers, the ceramic substrate board 11, and the braze foils 50 is heated to 640° C. to 650° C. in a state of pressed in the lamination direction in vacuum atmosphere so as to braze.

Thereby the aluminum circuit layers 121 are formed on one surface of the ceramic substrate board 11 and the aluminum heat radiation layers 131 are formed on the other surface.

—Step of Forming Copper Layer (Step of Forming Copper Circuit Layer)—

Figure 3C:
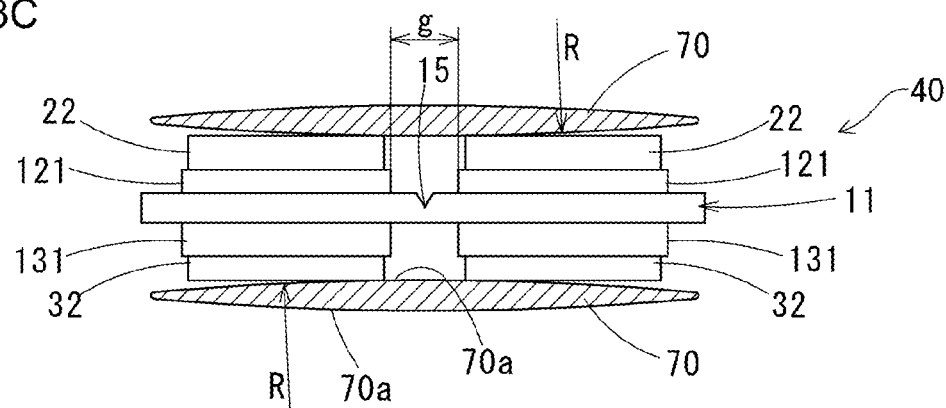
FIG. 3C It is a side view showing the method of manufacturing the bonded body for an insulation circuit substrate board in order.

As shown in FIG. 3C, copper boards 22 for the circuit layers are laminated on the respective aluminum circuit layers 121 bonded on the top surface of the ceramic substrate board 11. Similarly, copper boards 32 for the heat radiation layers are laminated on the aluminum heat radiation layers 131 bonded on the bottom surface of the ceramic substrate board 11.

The copper boards 22 for the circuit layers are individually laminated on the respective aluminum circuit layers 121. The copper boards 32 for the heat radiation layers are also laminated individually on the respective aluminum heat radiation layers 131.

Then, this laminate 40 is heated at lower than eutectic temperature of copper and aluminum in a state of pressed in the lamination direction so that the aluminum circuit layers 121 are bonded the copper boards 22 for the circuit layers and the aluminum heat radiation layers 131 are bonded to the copper heat radiation layers 132 by solid phase diffusion.

Figure 4:
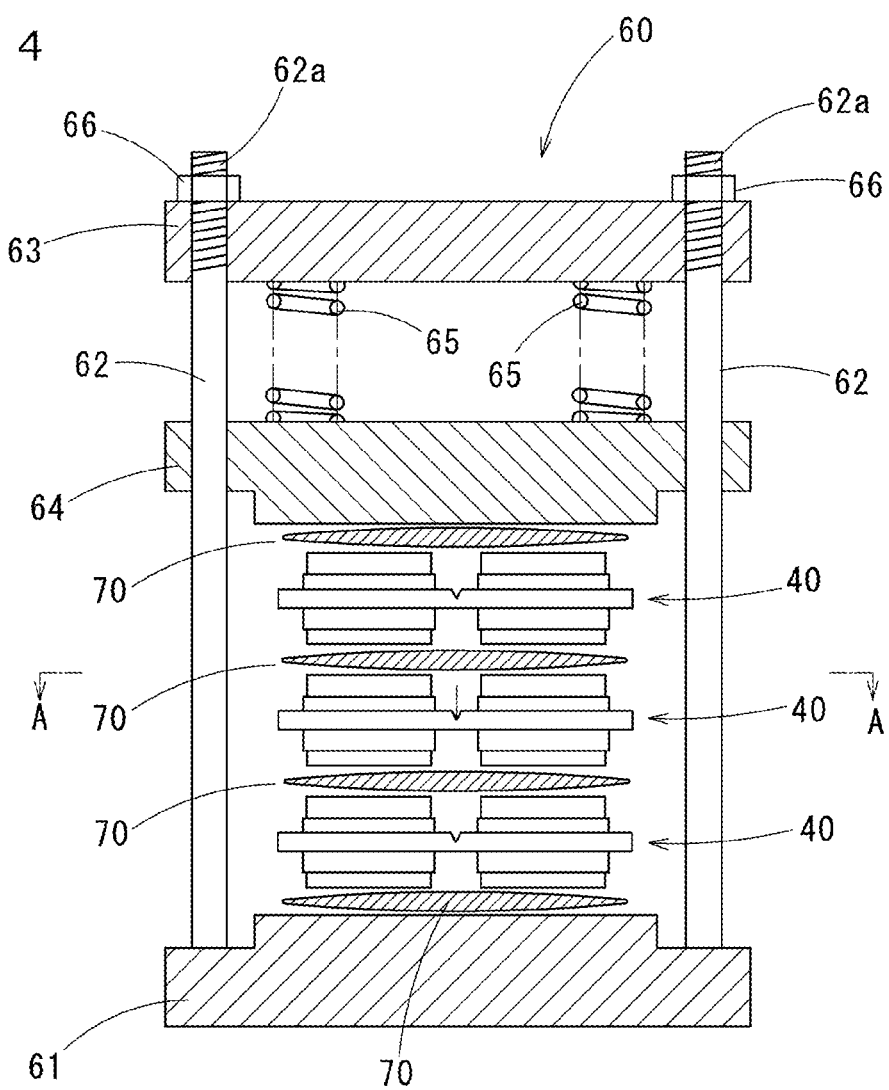
FIG. 4 It is a side view of a press device.
Figure 5:
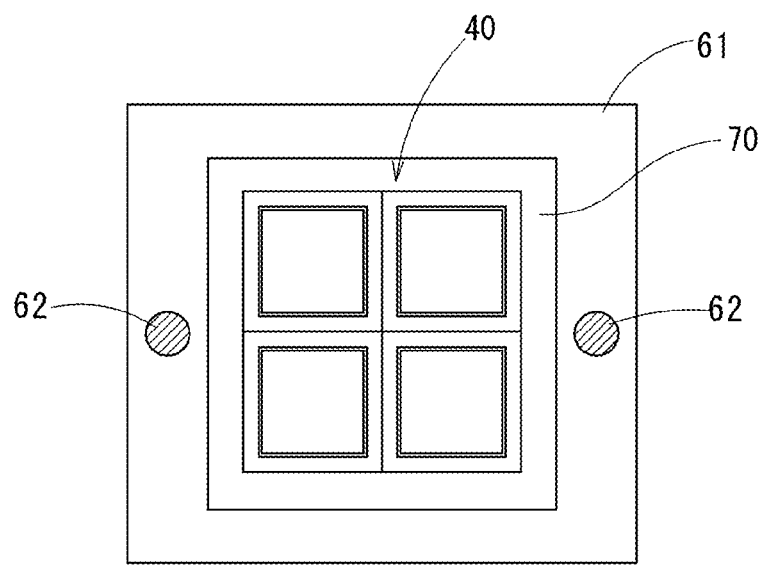
FIG. 5 It is an arrow view taken along the line A-A in FIG. 4.

FIG. 4 and FIG. 5 show a press device 60 used for this solid phase diffusion bonding. This press device 60 is provided with a base board (a press board at a fixed side) 61, guide posts 62 vertically mounted on a top surface of the base board 61, a backup board 63 held on upper end parts of the guide posts 62 movably along the guide posts 62, a pressing board (a pressing board at a movable side) 64 held on the guide posts 62 movably up and down between the base board 61 and the backup board 63, and energizing means 65 energizing the pressing board 64 downward such as springs provided between the backup board 63 and the pressing board 64. The backup board 63 and the pressing board 64 are arranged to be parallel with the base board 61.

At least the two guide posts 62 are provided vertically on the top surface of the base board 61. Screw parts 62a are formed on upper end of the respective guide posts 62 and nuts 66 are screwed to the screw parts 62a at the top surface of the backup board 63. In the present embodiment, between the base board and the pressing board 64, a plurality of the laminates 40 are arranged in a stacked manner. In this case, the laminates 40 are arranged inside the guide posts 62 and pressed in the lamination direction between the pressing boards 61 and 64 by screwing the nuts 66 on the screw parts 62a of the guide posts 62.

The guide posts 62 are not limited to two and may be provided four, one by each of the four corners on the top surface of the base board 61. Between the base board 61 and the pressing board 64, one laminate 40 may be arranged. Pressing means is not limited to this structure in which the nuts 66 are screwed on the screw parts 62a of the guide posts 62, but hot pressing or the like can also be used.

In this step, on both the surfaces of the laminates 40, support boards 70 are disposed to act the pressure effectively on the center in a surface direction of the laminates 40.

Both surfaces of the support boards 70 are formed to be convex curved surfaces 70a. The convex curved surfaces 70a have curved surface with a radius curvature R is 8000 mm or less and 60000 mm or more.

The support boards 70 are disposed so that the convex curved surfaces 70a (refer to FIG. 3) look toward the gaps "g" of the adjacent circuit layers 12 and the gaps "g" between the heat radiation layers 13 in the laminate 40. The surfaces (e.g., surfaces in contact with the base board 61 or the pressing board 64) of the support boards 70 not looking toward the circuit layers 12 may be flat surfaces.

Since the four circuit layers 12 which are rectangle in planar view are arranged so that one corner of them are respectively near to each other, the convex curved surfaces 70a are formed to be a spherical surface shape so as to protrude largest at a part where the four corners are near; however, a cylindrical surface may be used other than the spherical surface in accordance with an arranged number or the like of the circuit layers 12. For example, in a case in which two circuit layers are aligned and arranged, it is sufficient that the convex curved surface is formed into a cylindrical surface shape and an axis direction of the cylinder is arranged along a gap between the two circuit layers. Furthermore, the curved surface may be a surface of a spheroid or the like other than the spherical surface or the cylindrical surface. Within a range of the curvature radius R=8000 mm to 60000 mm, it may be one having single radius curvature or one made of a combination of a plurality of radius curvatures: it is possible to set appropriately in accordance with the number or arrangement of the circuit layers.

The support boards 70 are made of carbon material sheets. As the carbon material sheets, a laminate board of carbon sheets and graphite sheets for example. For the carbon sheets, for example, G-347 made by Asahi Graphite Inc. (thermal conductivity 116 W/mK, elastic modulus 10.8 GPa) can be used. For the graphite sheets, for example, T-5 made by Asahi Graphite Inc. (thermal conductivity 75.4 W/mK, elastic modulus 11.4 GPa), graphite sheets PF made by Toyo Tanso Co., Ltd. (compressibility 47%, recovery 14%) or the like can be used.

In the press device 60 structured as above described, a plurality of the laminates 40 are arranged with the support boards 70 therebetween. In this case, the support boards 70 are arranged so that the convex curved surfaces 70a are in contact with the copper boards 22 for the circuit layers and the copper boards 32 for the heat radiation layers of the laminates 40.

By maintaining pressure of 0.3 MPa or more and 3.5 MPa or less and holding in vacuum atmosphere at heating temperature of 400° C. or more and 548° C. or less for 5 minutes or more and 240 minutes or less, the copper boards 22 for the circuit layers and the copper boards 32 for the heat radiation layers are respectively bonded on the aluminum circuit layers 121 and the aluminum heat radiation layers 131 by solid phase diffusion between copper and aluminum.

In the bonded body 10 for the insulation circuit substrate board manufactured as above, the aluminum circuit layers 121 and the copper circuit layers 122 are laminated in order and bonded on one surface of the ceramic substrate board 11; and the aluminum heat radiation layers 131 and the copper heat radiation layers 132 are laminated in order and bonded on the other surface of the ceramic substrate board 11.

Figure 7:
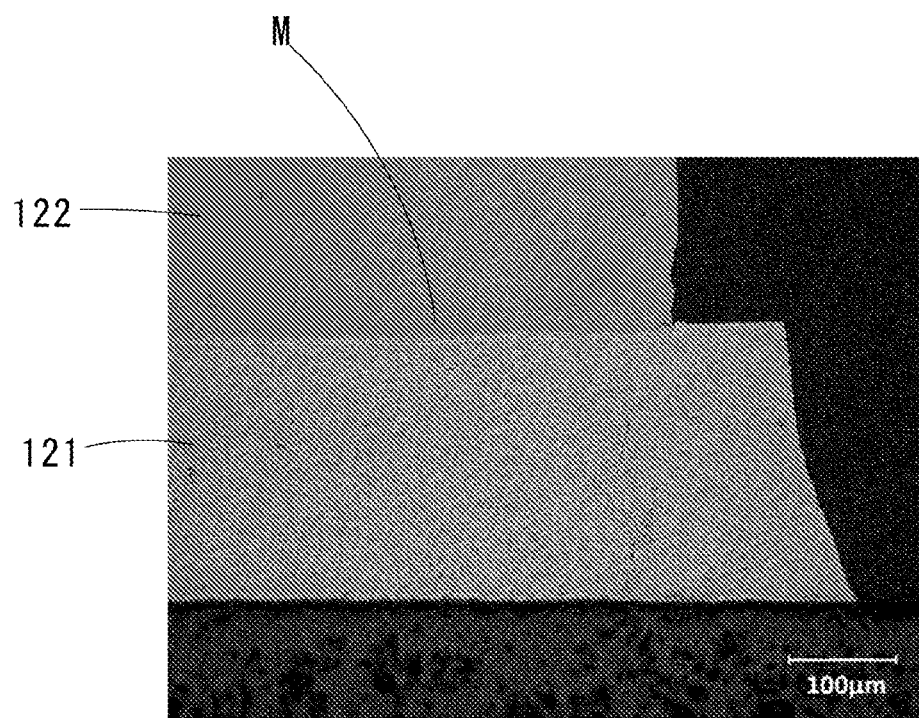
FIG. 7 It is a microscopy photograph of a cross section in a vicinity of a boundary between an aluminum layer and a copper layer at an edge part of a circuit layer in Sample 4.

Between the aluminum circuit layers 121 and the copper circuit layers 122, and between the aluminum heat radiation layers 131 and the copper heat radiation layers 132, intermetallic compound layers M are formed by solid phase diffusion bonding of aluminum and copper (refer to FIG. 7).

In this step of bonding copper boards, by pressing the convex curved surfaces 70a of the support boards 70 with being in contact with the copper boards 22 for the circuit layers and the copper boards 32 for the heat radiation layers, the M are formed with substantially uniform thickness over whole surfaces between the aluminum circuit layers 121 and the copper circuit layers 122 and between the aluminum heat radiation layers 131 and the copper heat radiation layers 132.

An average thickness of the M is 12 µm or more and 40 µm or less; an average thickness of a center side than a boundary is t1 and an average thickness of an edge part side than the boundary is t2, where the boundary is set at a position 50 µm from the edge part facing the gaps "g" between the adjacent copper circuit layers 122; and a thickness ratio t2/t1 is 30% or more.

—Step of Dividing—

Figure 3D:
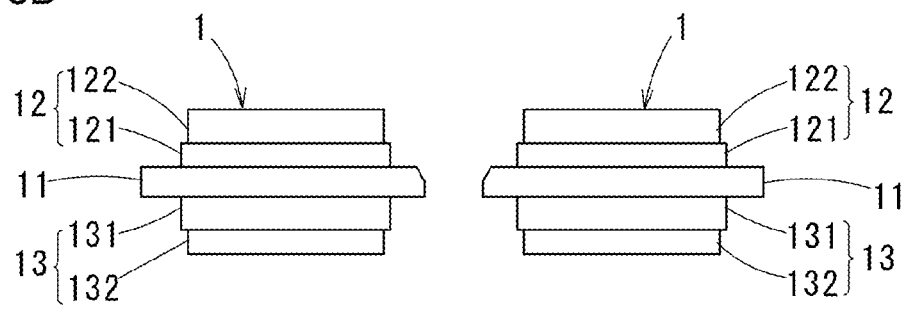
FIG. 3D It is a side view showing the method of manufacturing the bonded body for an insulation circuit substrate board in order.

At the last, as shown in FIG. 3D, the ceramic substrate board 11 is split into a plurality of pieces along the scribe lines 15.

As explained above, according to the manufacturing method of the present embodiment, by pressing the convex curved surfaces 70a of the support boards 70 with being in contact with the copper boards 22 for the circuit layers and the copper boards 32 for the heat radiation layers; it is possible to form the M over the whole surfaces with substantially the uniform thickness by the solid phase diffusion bonding between the aluminum circuit layers 121 and the copper circuit layers 122 and between the aluminum heat radiation layers 131 and the copper heat radiation layers 132 and it is possible to bond them firmly without bonding defects.

In this case, the curvature radius R of the convex curved surfaces 70a is too small if it is less than 8000 mm, so that the load is too concentrated on the vicinity of the edge parts beside the gaps "g" of the copper circuit layers 122 and the copper heat radiation layers 132 and in contrast the load on the vicinity of the outer peripheral edge parts is not enough; as a result, the bonding defects may be occur in the outer peripheral edge parts. If the curvature radius R of the convex curved surfaces 70a is more than 60000 mm it is almost a flat surface, so that an improving effect of bonding is poor in the vicinity of the edge parts beside the gaps "g" of the copper circuit layers 122 and the copper heat radiation layers 132.

Figure 6:
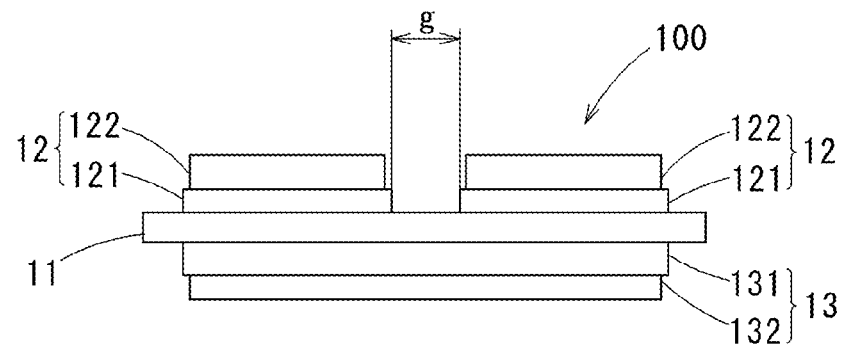
FIG. 6 It is a plan view showing a bonded body (a power module substrate board) for an insulation circuit substrate board of another embodiment.

In the above embodiment, a plurality of the power module substrate boards 1 are manufactured by forming the scribe lines 15 on the ceramic substrate board 11; the present invention can be applied if a plurality of the circuit layers 12 are separated even in a case in which one power module substrate board (an insulation circuit substrate board) 1 is manufactured from the ceramic substrate board 11 without the scribe lines 15 (FIG. 6).

A bonded body 100 for an insulation circuit substrate board is formed to be a state in which the circuit layers 12 are separated into two on one surface of the ceramic substrate board 11, in which the copper circuit layers 122 are bonded in a laminate state with the aluminum circuit layers 121 therebetween respectively. On the other surface of the ceramic substrate board 11, one heat radiation layer 13 is formed in which one copper heat radiation layer 132 is laminated and bonded with one aluminum heat radiation layer 131 therebetween.

Also in the bonded body 100 for the insulation circuit substrate board, after forming the aluminum circuit layers 121 and the aluminum heat radiation layers 131 on the ceramic substrate board 11 by braze bonding, the copper boards 22 for the circuit layers are bonded on the aluminum circuit layers 121 and the copper board 32 for the heat radiation layer is bonded on the aluminum heat radiation layer 131 by the solid phase diffusion bonding. At this time, by pressing using the support boards 70 having the convex curved surfaces 70a, the vicinity of the edge parts of the copper boards 22 for the circuit layers beside the gaps "g" are also pressed, so that the copper circuit layers 122 firmly bonded on the aluminum circuit layers 121 can be formed.

In this case, the circuit layers 12 are a square of 5 mm or more and 100 mm or less; the gaps "g" of the circuit layers 12 are 1 mm or more and 20 mm or less.

After forming the copper circuit layers 122 and the copper heat radiation layers 132 the bonded body 100 for the insulation circuit substrate board is used as the power module substrate board 1 (the insulation circuit substrate board) as it is.

Besides, the present invention can be applied for a case in which a circuit layer having a double structure of an aluminum layer and a copper layer is formed o none surface of a ceramic substrate board, it is not necessary that a heat radiation layer having a double structure on the other surface of the ceramic substrate board as in the embodiment.

Examples

A step of bonding aluminum boards was carried out as follows: two aluminum boards (38 mm×38 mm, thickness 0.25 mm, 4N—Al) were laminated with a gap 2 mm on a surface of a ceramic substrate board (40 mm×80 mm, thickness 0.635 mm, AlN) to be an insulation layer; one aluminum board (38 mm×78 mm, thickness 9.25 mm, 4N—Al) was laminated on the other surface of the ceramic substrate board, so that aluminum layers were formed by braze bonding respectively. Al—Si brazing foils (thickness 14 μm) were used as brazing material, it was added a pressure 0.3 MPa in a lamination direction and heated at temperature 640° C. for 40 minutes to bond.

A step of bonding copper boards was carried out as follows: copper boards (37 mm×37 mm, thickness 0.3 mm, oxygen-free copper) were laminated to be positioned on the aluminum layers formed on the surface of the ceramic substrate board, and a copper board (37 mm×77 mm, thickness 0.3 mm, oxygen-free copper) was laminated on the aluminum layer formed on the bottom surface of the ceramic substrate board; and it was added a pressure 1 MPa in the lamination direction using a support board having a curvature radius shown in Table 1 and heated at temperature 540° C. for 90 minutes in vacuum atmosphere to bond by solid phase diffusion.

Samples 1 to 11 made as above were observed in a microscope at a cross section substantially perpendicular to an edge surface passing through substantially a center of a circuit layer to find an intermetallic compound layer between the aluminum layers and the copper layers. An average thickness t1 of the intermetallic compound layer in a center side of a position-of-50 μm from an edge part beside a gap between the adjacent circuit layers and an average thickness t2 of the intermetallic compound layer in the edge part side of the position-of-50 μm from the edge part were measured; and a thickness ratio t2/t1 was calculated.

As evaluation of bonding ability, regarding obtained Samples 1 to 11, solder was mounted on a copper circuit layer, and the intermetallic compound layer was checked after reflowing 285° C.×10 minutes by microscope observation at a cross section along the B-B line shown in FIG. 2 (on a line through substantially the center of the circuit layer and substantially perpendicular to the end surface). Observing with the microscope VK-X210 made by Keyence Corporation, it was evaluated "not good" if breakages (cracks) were found in the intermetallic compound layer at the edge part, or it is evaluated "good" if the cracks were not found. Results are shown in Table 1.

TABLE 1

| Samples | CURVATURE RADIUS R (mm) OF SUPPORT BOARD | 1/R (1/m) | AVERAGE THICKNESS OF INTERMETALLIC COMPOUND LAYER | | | BONDING ABILITY |
| --- | --- | --- | --- | --- | --- | --- |
| | | | CENTER PART t1 (μm) | EDGE PART t2 (μm) | THICKNESS RATIO t2/t1 | |
| 1 | 8000 | 0.125 | 34 | 14.0 | 41.2 | GOOD |
| 2 | 10000 | 0.100 | 32 | 17.0 | 53.1 | GOOD |
| 3 | 15000 | 0.067 | 31 | 19.5 | 62.9 | GOOD |
| 4 | 20000 | 0.050 | 32 | 20.0 | 62.5 | GOOD |
| 5 | 25000 | 0.040 | 33 | 19.0 | 57.6 | GOOD |
| 6 | 30000 | 0.033 | 35 | 17.5 | 50.0 | GOOD |
| 7 | 40000 | 0.025 | 36 | 15.5 | 43.1 | GOOD |
| 8 | 60000 | 0.017 | 36 | 12.0 | 33.3 | GOOD |
| 9 | 70000 | 0.014 | 34 | 10.0 | 29.4 | NOT GOOD |
| 10 | 6000 | 0.167 | 34 | 6.0 | 17.6 | NOT GOOD |
| 11 | ∞ | 0.000 | 35 | 9.0 | 25.7 | NOT GOOD |

Samples 1 to 8 in which the radius curvature of a convex surface was 8000 mm to 60000 were all "good" in the evaluation of the bonding ability. The thickness ratio of the intermetallic compound layer in these cases was 33.3% or more: it is recognized that good result was obtained if it was 30% or more.

Figure 8:
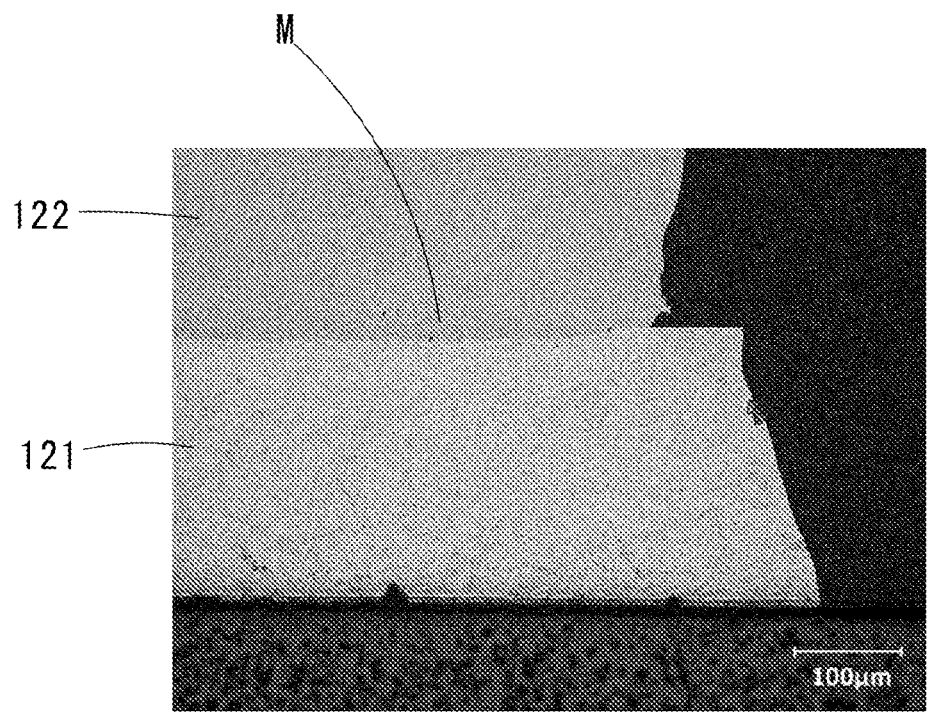
FIG. 8 It is a microscopy photograph of a cross section in a vicinity of a boundary between an aluminum layer and a copper layer at an edge part of a circuit layer in Sample 10.

FIG. 7 is a microscopy photograph along the cross section taken along the line B-B at the edge part of the aluminum layer and the copper layer of Sample 4 before solder reflowing. FIG. 8 is a microscopy photograph of Sample 10 before solder reflowing. In FIG. 7, the intermetallic compound layer M was formed to the edge of the end part, so that the aluminum layer and the copper layer were bonded. In contrast, in FIG. 8, an unbonded part was generated at the edge of the end part.

INDUSTRIAL APPLICABILITY

In the bonded body for the insulation circuit substrate board, adding uniform load on the inside end part of the adjacent copper circuit layer beside the gaps, it is possible to prevent the bonding defects.

REFERENCE SIGNS LIST

1 Power module substrate board (Insulation circuit substrate board)
10 Bonded body for insulation circuit substrate board
11 Ceramic substrate board
12 Circuit layer
13 Heat radiation layer
15 Scribe lines
21 Aluminum board for circuit layer
22 Copper board for circuit layer
31 Aluminum board for heat radiation layer
32 Copper board for heat radiation layer
40 Laminate
50 Brazing foil
60 Press device
61 Base board (Press board at fixed side)
62 Guide post
62a Screw part
63 Backup board
64 Pressing board (Pressing board at movable side)
65 Nut
70 Support board
70a Convex curved surface
100 Bonded body for insulation circuit substrate board (Power module substrate board)
121 Aluminum circuit layer (Aluminum layer)
122 Copper circuit layer (Copper layer)
131 Aluminum heat radiation layer (Aluminum layer)
132 Copper heat radiation layer (Copper layer)
M Intermetallic compound layer

The invention claimed is:

1. A method of manufacturing a bonded body for an insulation circuit substrate board comprising steps of:
   forming an aluminum circuit layer forming a plurality of aluminum circuit layers on one surface on a ceramic substrate board; and
   a step of forming a copper circuit layer, by laminating copper boards for the circuit layers respectively on the aluminum circuit layers; arranging this laminate between a pair of support boards having a convex curved surface on at least one surface and arranged to face the convex curved surfaces toward each other; and pressing the laminate in a lamination direction by moving the support boards to a facing direction and heating in this pressing state, so as to bond the copper boards on the aluminum circuit layers by solid phase diffusion, wherein
   in the step of forming the copper circuit layers, the support boards are arranged so that at least one of the convex curved surfaces are in contact with a plurality of the copper boards for the circuit layers adjacent in the laminate.

2. The method of manufacturing a bonded body for an insulation circuit substrate board according to claim 1, wherein the convex curved surfaces of the support boards have a curvature radius not less than 8000 mm and not more than 60000 mm.

3. The method of manufacturing a bonded body for an insulation circuit substrate board according to claim 1, wherein the support boards are made of a carbon material sheet.

4. The method of manufacturing a bonded body for an insulation circuit substrate board according to claim 3, wherein the carbon material sheet is a laminate board of one or more carbon sheets and one or more graphite sheets.

5. The method of manufacturing a bonded body for an insulation circuit substrate board according to claim 1, wherein in the support boards, the one surface is the convex curved surface and the other surface is a flat surface.

6. The method of manufacturing a bonded body for an insulation circuit substrate board according to claim 1, wherein the convex curved surface is a spherical surface.

7. The method of manufacturing a bonded body for an insulation circuit substrate board according to claim 1, wherein the convex curved surface is a cylindrical surface.

8. The method of manufacturing a bonded body of an insulation circuit substrate board according to claim 1, wherein
   arranging a pair of the support boards between a pair of pressing boards facing in the lamination direction to each other,
   holding a pair of the pressing boards so as to approach or be away from each other along the lamination direction on at least two guide post provided along the lamination direction, and
   pressing the laminate with a pair of the support boards by approaching a pair of the pressing boards each other in the step of forming the copper circuit layers.

9. The method of manufacturing a bonded body for an insulation circuit substrate board according to claim 2, wherein the support boards are made of a carbon material sheet.

10. The method of manufacturing a bonded body for an insulation circuit substrate board according to claim 2, wherein in the support boards, the one surface is the convex curved surface and the other surface is a flat surface.

11. The method of manufacturing a bonded body for an insulation circuit substrate board according to claim 3, wherein in the support boards, the one surface is the convex curved surface and the other surface is a flat surface.

12. The method of manufacturing a bonded body for an insulation circuit substrate board according to claim 4, wherein in the support boards, the one surface is the convex curved surface.

13. The method of manufacturing a bonded body for an insulation circuit substrate board according to claim 2, wherein the convex curved surface is a spherical surface.

14. The method of manufacturing a bonded body for an insulation circuit substrate board according to claim 3, wherein the convex curved surface is a spherical surface.

15. The method of manufacturing a bonded body for an insulation circuit substrate board according to claim 4, wherein the convex curved surface is a spherical surface.

16. The method of manufacturing a bonded body for an insulation circuit substrate board according to claim 5, wherein the convex curved surface is a spherical surface.

17. The method of manufacturing a bonded body for an insulation circuit substrate board according to claim 2, wherein the convex curved surface is a cylindrical surface.

18. The method of manufacturing a bonded body for an insulation circuit substrate board according to claim 3, wherein the convex curved surface is a cylindrical surface.

19. The method of manufacturing a bonded body for an insulation circuit substrate board according to claim 4, wherein the convex curved surface is a cylindrical surface.

20. The method of manufacturing a bonded body for an insulation circuit substrate board according to claim 5, wherein the convex curved surface is a cylindrical surface.

21. The method of manufacturing a bonded body of an insulation circuit substrate board according to claim 2, wherein
arranging a pair of the support boards between a pair of pressing boards facing in the lamination direction to each other,
holding a pair of the pressing boards so as to approach or be away from each other along the lamination direction on at least two guide post provided along the lamination direction, and
pressing the laminate with a pair of the support boards by approaching a pair of the pressing boards each other in the step of forming the copper circuit layers.

22. The method of manufacturing a bonded body of an insulation circuit substrate board according to claim 3, wherein
arranging a pair of the support boards between a pair of pressing boards facing in the lamination direction to each other,
holding a pair of the pressing boards so as to approach or be away from each other along the lamination direction on at least two guide post provided along the lamination direction, and
pressing the laminate with a pair of the support boards by approaching a pair of the pressing boards each other in the step of forming the copper circuit layers.

23. The method of manufacturing a bonded body of an insulation circuit substrate board according to claim 4, wherein
arranging a pair of the support boards between a pair of pressing boards facing in the lamination direction to each other,
holding a pair of the pressing boards so as to approach or be away from each other along the lamination direction on at least two guide post provided along the lamination direction, and
pressing the laminate with a pair of the support boards by approaching a pair of the pressing boards each other in the step of forming the copper circuit layers.

24. The method of manufacturing a bonded body of an insulation circuit substrate board according to claim 5, wherein
arranging a pair of the support boards between a pair of pressing boards facing in the lamination direction to each other,
holding a pair of the pressing boards so as to approach or be away from each other along the lamination direction on at least two guide post provided along the lamination direction, and
pressing the laminate with a pair of the support boards by approaching a pair of the pressing boards each other in the step of forming the copper circuit layers.

25. The method of manufacturing a bonded body of an insulation circuit substrate board according to claim 6, wherein
arranging a pair of the support boards between a pair of pressing boards facing in the lamination direction to each other,
holding a pair of the pressing boards so as to approach or be away from each other along the lamination direction on at least two guide post provided along the lamination direction, and
pressing the laminate with a pair of the support boards by approaching a pair of the pressing boards each other in the step of forming the copper circuit layers.

26. The method of manufacturing a bonded body of an insulation circuit substrate board according to claim 7, wherein
arranging a pair of the support boards between a pair of pressing boards facing in the lamination direction to each other,
holding a pair of the pressing boards so as to approach or be away from each other along the lamination direction on at least two guide post provided along the lamination direction, and
pressing the laminate with a pair of the support boards by approaching a pair of the pressing boards each other in the step of forming the copper circuit layers.

* * * * *